United States Patent
el-Hamdi et al.

(10) Patent No.: US 6,403,455 B1
(45) Date of Patent: Jun. 11, 2002

(54) METHODS OF FABRICATING A MEMORY DEVICE

(75) Inventors: Mohamed el-Hamdi; Sam E. Sawaya, both of Austin; Scott Balfour, Sherman; Louay M. Semaan, Pflugerville, all of TX (US)

(73) Assignee: Samsung Austin Semiconductor, L.P., Austin, TX (US)

( * ) Notice: Subject to any disclaimer, the term of this patent is extended or adjusted under 35 U.S.C. 154(b) by 0 days.

(21) Appl. No.: 09/653,228

(22) Filed: Aug. 31, 2000

(51) Int. Cl.[7] .................. H01L 21/22; H01L 21/38; H01L 21/04; H01L 21/20
(52) U.S. Cl. .................. 438/565; 438/510; 438/542; 438/398
(58) Field of Search ................ 438/586, 542, 438/510, 565, 964, 239, 255, 260, 381, 398

(56) References Cited

U.S. PATENT DOCUMENTS

| | | |
|---|---|---|
| 4,203,158 A | 5/1980 | Frohman-Bentchkowsky et al. ... 365/188 |
| 4,274,012 A | 6/1981 | Simko ..................... 307/238.3 |
| 4,300,212 A | 11/1981 | Simko ..................... 365/185 |
| 4,314,265 A | 2/1982 | Simko ..................... 357/23 |
| 4,486,769 A | 12/1984 | Simko ..................... 357/41 |
| 4,520,461 A | 5/1985 | Simko ..................... 365/184 |
| 4,617,652 A | 10/1986 | Simko ..................... 365/203 |
| 4,742,018 A | 5/1988 | Kimura et al. ............... 437/48 |
| 4,758,986 A | 7/1988 | Kno ....................... 368/185 |
| 4,763,299 A | 8/1988 | Hazani .................... 365/51 |
| 4,845,538 A | 7/1989 | Hazani .................... 357/23.5 |
| 4,958,318 A | 9/1990 | Harari .................... 365/169 |
| 4,974,040 A | 11/1990 | Taguchi et al. ............. 357/23.6 |

(List continued on next page.)

FOREIGN PATENT DOCUMENTS

| | | | |
|---|---|---|---|
| EP | 0295709 A2 | 12/1988 | ........... H01L/27/10 |
| JP | 53-123687 | 10/1978 | ........... H01L/27/10 |
| JP | 57-112066 | 7/1982 | ........... H01L/27/10 |
| JP | 58-134458 | 8/1983 | ........... H01L/27/04 |
| JP | 59-56754 | 4/1984 | ........... H01L/27/04 |
| JP | 62-48062 | 3/1987 | ........... H01L/27/10 |
| JP | 64-42161 | 2/1989 | ........... H01L/27/04 |

OTHER PUBLICATIONS

Stanley Wolf and Richard N. Tauber; Silicon Processing for the VLSI Era, Volume 1—Process Technology; p. 182; 1986.

T. Mine et al.; Capacitance–Enhanced Stacked–Capacitor with Engraved Storage Electrode for Deep Submicron DRAMs; pp. 137–140; Aug. 1989.

H. A. Richard Wagener; Endurance Model for Textured–Poly Floating Gate Memories–IEDM; pp. 480–483; 1984.

H. Arima et al.; A Novel Stacked Capacitor Cell With Dual Plate for 64Mb DRAMs–IDEM; 651–654; 1990.

(List continued on next page.)

Primary Examiner—Vu A. Le
Assistant Examiner—Adam Pyonin
(74) Attorney, Agent, or Firm—Timothy M. Honeycutt

(57) ABSTRACT

Various methods of fabricating circuit devices are provided. In one aspect, a method of fabricating a circuit device on a substrate is provided. The method includes forming a doped silicon structure on the substrate and forming a hemispherical grain silicon film on the silicon structure. The substrate is heated from a first temperature to a second temperature while undergoing exposure to a dopant gas to add a dopant to the hemispherical grain silicon film. The method provides for improved capacitor electrode fabrication via concurrent gas exposure and substrate temperature ramp-up. In this way, dopant gas is introduced before the doped silicon structure transitions from an amorphous state to a polycrystalline state.

20 Claims, 3 Drawing Sheets

U.S. PATENT DOCUMENTS

| | | | |
|---|---|---|---|
| 5,040,036 A | 8/1991 | Hazani | 357/23.5 |
| 5,043,780 A | 8/1991 | Fazan et al. | 357/23.6 |
| 5,047,814 A | 9/1991 | Hazani | 357/23.5 |
| 5,087,583 A | 2/1992 | Hazani | 437/43 |
| 5,099,297 A | 3/1992 | Hazani | 357/23.5 |
| 5,134,086 A | 7/1992 | Ahn | 437/52 |
| 5,153,685 A | 10/1992 | Murata et al. | 357/23.6 |
| 5,162,247 A | 11/1992 | Hazani | 437/43 |
| 5,162,248 A | 11/1992 | Dennison et al. | 437/52 |
| 5,166,904 A | 11/1992 | Hazani | 365/218 |
| 5,227,322 A | 7/1993 | Ko et al. | 437/47 |
| 5,247,346 A | 9/1993 | Hazani | 257/314 |
| 5,278,785 A | 1/1994 | Hazani | 365/182 |
| 5,296,385 A | 3/1994 | Moslehi et al. | 437/20 |
| 5,302,540 A | 4/1994 | Ko et al. | 437/47 |
| 5,303,185 A | 4/1994 | Hazani | 365/185 |
| 5,304,505 A | 4/1994 | Hazani | 437/52 |
| 5,332,914 A | 7/1994 | Hazani | 257/320 |
| 5,340,765 A | 8/1994 | Dennison et al. | 437/52 |
| 5,350,707 A | 9/1994 | Ko et al. | 437/52 |
| 5,352,923 A | 10/1994 | Boyd et al. | 257/536 |
| 5,358,888 A | 10/1994 | Ahn et al. | 437/52 |
| 5,405,801 A | 4/1995 | Han et al. | 437/60 |
| 5,418,180 A | 5/1995 | Brown | 437/60 |
| 5,447,878 A | 9/1995 | Park et al. | 437/52 |
| 5,466,628 A | 11/1995 | Lee et al. | 437/60 |
| 5,476,805 A | 12/1995 | Woo et al. | 437/52 |
| 5,498,562 A | 3/1996 | Dennison et al. | 437/52 |
| 5,597,754 A | 1/1997 | Lou et al. | 437/52 |
| 5,597,756 A | 1/1997 | Fazan et al. | 437/52 |
| 5,641,707 A * | 6/1997 | Moslehi | 438/513 |
| 5,714,401 A | 2/1998 | Kim et al. | 437/52 |
| 5,721,147 A | 2/1998 | Yoon | 437/31 |
| 5,759,894 A | 6/1998 | Tseng et al. | 438/255 |
| 5,770,500 A | 6/1998 | Batra et al. | 438/255 |
| 5,792,689 A | 8/1998 | Yang et al. | 438/253 |
| 5,798,280 A | 8/1998 | Mathews et al. | 437/165 |
| 5,798,545 A | 8/1998 | Iwasa et al. | 257/301 |
| 5,804,480 A | 9/1998 | Lu et al. | 438/253 |
| 5,804,481 A | 9/1998 | Tseng | 438/255 |
| 5,854,095 A | 12/1998 | Kang et al. | 438/255 |
| 5,874,330 A | 2/1999 | Ahn | 438/230 |
| 5,882,991 A * | 3/1999 | Paranjpe | 438/563 |
| 5,943,584 A * | 8/1999 | Shim et al. | 438/398 |
| 6,015,743 A * | 1/2000 | Zahurak et al. | 438/398 |
| 6,069,053 A | 5/2000 | Ping et al. | 438/398 |
| 6,194,265 B1 | 2/2001 | Chang et al. | 438/255 |
| 6,218,260 B1 * | 4/2001 | Lee et al. | 438/398 |
| 6,255,159 B1 | 7/2001 | Thakur | 438/253 |
| 6,326,277 B1 | 12/2001 | DeBoer | 438/398 |
| 2001/0044182 A1 | 11/2001 | Sakoh et al. | 438/255 |
| 2002/0004273 A1 | 1/2002 | Manabe | 438/254 |

OTHER PUBLICATIONS

M. Sakao et al.; A Capacitor–Over–Bit–Line (COB) Cell With a Hemispherical–Grain Storage Node for 64Mb DRAMs–IEEE; 655–658; 1990.

H. Watanabe et al.; A New Cylindrical Capacitor Using Hemispherical Grained Si (HSG–Si) for 256Mb DRAMs; 259–262; 1992.

Hirohito Watanabe et al.; Hemispherical Grained Si Formation on in–situ Phosphorous Doped Amorphous–Si Electrode for 256Mb DRAM's Capacitor—IEEE transactions on electron devices; vol. 42, No. 7, pp. 1247–1254; Jul. 1995.

* cited by examiner

US 6,403,455 B1

METHODS OF FABRICATING A MEMORY DEVICE

BACKGROUND OF THE INVENTION

1. Field of the Invention

This invention relates generally to semiconductor processing, and more particularly to methods of fabricating memory devices, such as a capacitor electrodes, utilizing doping anneals.

2. Description of the Related Art

Device scaling in integrated circuit design has produced an attendant decrease in the available wafer areas for devices, such as dynamic random access memory cells ("DRAMs"). As a consequence, memory cell capacitors must be squeezed into ever shrinking spaces. Because the capacitance of a memory cell capacitor is proportional to the surface area of the capacitor electrodes, the job of maintaining or even increasing device capacitance while minimum geometries continue to shrink is difficult. Because DRAM memory cell operation typically improves with increased capacitance, a variety of methods have been developed in an attempt to increase storage electrode surface areas while at the same time maintaining or reducing wafer area taken up by a memory cell. Examples of electrode designs that have greater surface area include trench and stacked capacitor configurations as well as cylindrical and finned capacitor configurations.

One method for increasing electrode surface area involves the formation of a roughened or irregular electrode surface. Methods for providing a roughened electrode surface include those employing hemispherical grain ("HSG") silicon. In one conventional method, in-situ doped silicon is formed in amorphous or polycrystalline states on a substrate by reacting a silicon source gas such as silane ($SiH_4$) or disilane ($Si_2H_6$) with a dopant gas such as phosphine ($PH_3$). The doped silicon film is then masked and etched to define the desired shape of the electrode. Thereafter, an HSG silicon film is formed on the electrode to provide a greater surface area. The silicon electrode is exposed to a silicon source gas at medium temperatures to form silicon nuclei on the outer surface of the electrode. The HSG silicon film is then grown in an ultra high vacuum environment. The HSG may not grow with sufficient surface area if the dopant concentration of the capacitor electrode exceeds certain levels. Accordingly, the capacitor electrode is initially formed with a relatively light dopant level to facilitate HSG silicon growth. The additional dopant needed to provide the electrode with desirable conductivity is provided following HSG silicon growth by performing an anneal in a $PH_3$ ambient.

A conventional post-HSG silicon growth $PH_3$ anneal involves heating the wafer or substrate up to a preselected annealing temperature of about 600 to 700° C. After the wafer reaches the annealing temperature, a flow of $PH_3$ is introduced. The goal of the anneal is to diffuse a sufficient number of phosphorus atoms into the HSG grains to raise the dopant concentration to an acceptable level. However, manufacturing experience has demonstrated that a physical mechanism associated with the conventional phosphorus anneal is limiting phosphorus diffusion into the silicon electrode. As a result, the conventional phosphorus doping anneal following HSG silicon growth may not yield desired doping levels.

The present invention is directed to overcoming or reducing the effects of one or more of the foregoing disadvantages.

SUMMARY OF THE INVENTION

In accordance with one aspect of the present invention, a method of fabricating a circuit device on a substrate is provided. The method includes forming a doped silicon structure on the substrate and forming a hemispherical grain silicon film on the silicon structure. The substrate is heated from a first temperature to a second temperature while undergoing exposure to a dopant gas to add a dopant to the hemispherical grain silicon film.

In accordance with another aspect of the present invention, a method of fabricating a capacitor structure on a substrate is provided. The method includes forming a doped silicon structure on the substrate and forming a hemispherical grain silicon film on the silicon structure. The substrate is heated from a first temperature to a second temperature while undergoing exposure to a dopant gas to add a dopant to the hemispherical grain silicon film. A capacitor dielectric film is formed on the hemispherical grain silicon film.

In accordance with another aspect of the present invention, a method of fabricating a circuit device on a substrate is provided. The method includes forming an access transistor; and a capacitor electrode. The capacitor electrode is fabricated by forming a doped silicon structure on the substrate, forming a hemispherical grain silicon film on the silicon structure, and heating the substrate from a first temperature to a second temperature while exposing the substrate to a dopant gas to add a dopant to the hemispherical grain silicon film.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
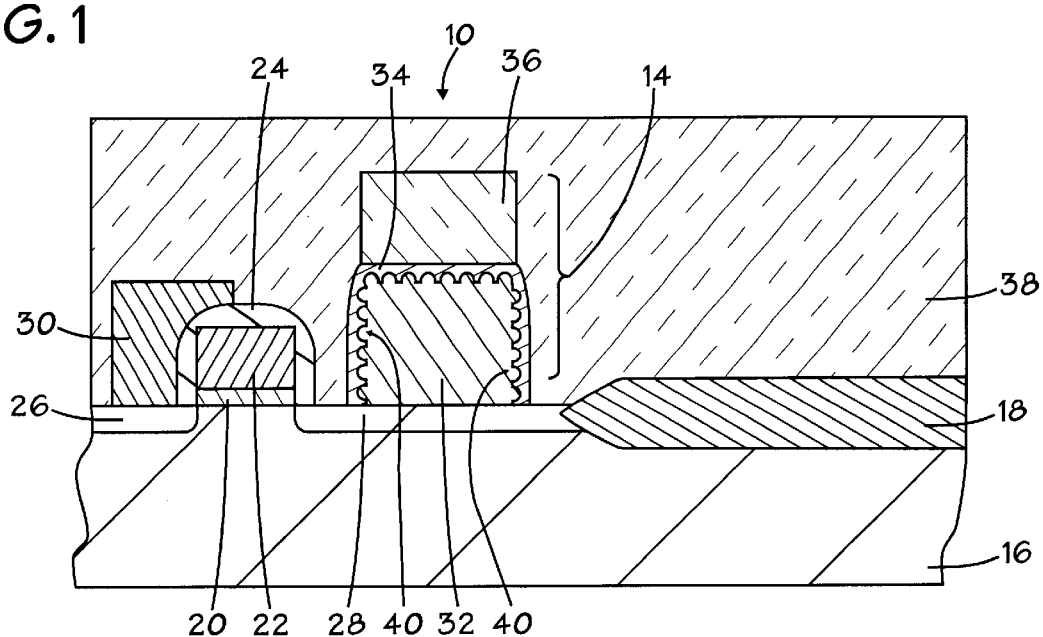
FIG. 1 is a cross-sectional view of an exemplary embodiment of a circuit device or memory cell in accordance with the present invention.
Figure 2:
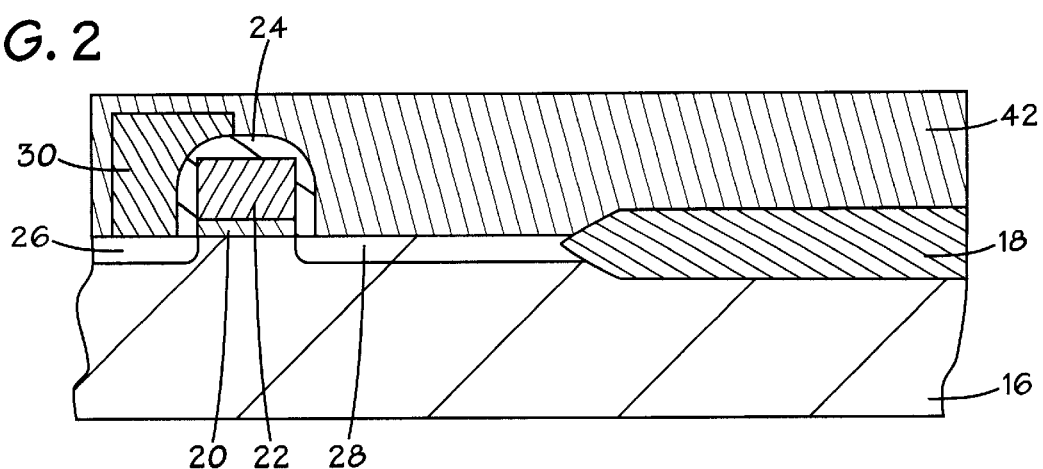
FIG. 2 is a cross-sectional view of an exemplary embodiment of a partially completed circuit device or memory cell depicting deposition of a silicon film in accordance with the present invention.

In the drawings described below, reference numerals are generally repeated where identical elements appear in more than one figure. FIG. 1 is a simplified cross-sectional view of an exemplary embodiment of a memory cell 10 that includes an access transistor 12 and a capacitor 14 formed on semiconductor substrate 16. The memory cell 10 is electrically isolated laterally by field oxide regions, one of which is shown and designated 18 for simplicity of illustration. The substrate 16 may be composed of n-type silicon, p-type silicon, silicon-on-insulator or other suitable substrate materials. The access transistor 12 includes a gate dielectric layer 20 formed on the substrate 16, a gate electrode 22 positioned on the gate dielectric layer 20 and a blanket insulating film 24 covering the gate dielectric layer 20 and the gate electrode 22. Source/drain regions 26 and 28 are formed in the substrate. A bit line 30 is positioned in contact with the source/drain region 26.

The storage capacitor 14 includes a storage electrode 32 positioned in contact with the source/drain region 28, and a capacitor dielectric 34 formed over the storage electrode 32. An upper electrode 36 is formed on the capacitor dielectric 34. An interlevel dielectric layer 38 is formed over the memory cell 10. The storage electrode 32 includes a bulk amorphous or polycrystalline silicon structure surrounded by an HSG silicon layer 40. The gate electrode 22, the upper electrode 36 and the bit line 30 may be composed of polysilicon, amorphous silicon, aluminum, refractory metal, refractory metal silicides or the like. The capacitor dielectric 34 and the insulating film 24 may be composed of oxide, silicon nitride, laminates of these or other dielectrics. The interlevel dielectric 24 may be composed of tetraethyl-orthosilicate, boro-phospho-silicate glass or the like.

An exemplary process flow for fabricating the circuit device or memory cell 10 in accordance with the present invention may be understood by referring now to FIGS. 2, 3, 4, 5, 6 and 7, and initially to FIG, 2. The access transistor 12 and its constituent components may be initially fabricated on the substrate 16 using well-known transistor fabrication techniques. For example, the gate dielectric layer 20 and the gate electrode 22 may be sequentially grown or deposited as blanket films and thereafter etched to define the desired pattern. Thereafter, the blanket insulating film 24 may be deposited or grown as desired. The impurity regions 26 and 28 may be formed by ion implantation or diffusion as desired. The fabrication of the field oxide regions 18 may be performed prior to transistor fabrication by well-knowm techniques, such as, for example, wet or dry oxidation of the substrate 16. The gate dielectric layer 22 may be oxide, silicon nitride, laminates of these or the like. The gate electrode 22 may be polysilicon, amorphous silicon, aluminum, refractory metal silicides or the like.

Turning now to the fabrication of the storage capacitor 14, initially a silicon film 42 is formed on the substrate 16. The film 42 is deposited in a generally amorphous state with in-situ doping via n-type or p-type dopant. The in-situ doping may be facilitated by reacting a silicon source gas such as $SiH_4$ or $Si_2H_6$ with a dopant source gas such as, for example, $AsH_3$, $AsS_3$, $PH_3$, $PF_3$, $POCl_3$, $B_2A_6$, $BF_3$, $BCl_3$, etc. depending on the dopant desired (i.e., either n-type or p-type). In an exemplary embodiment, the film 42 is established by chemical vapor deposition with in-situ phosphorus doping via $PH_3$. The deposition temperature may be about 480 to 550° C. The film 42 may have a thickness of about 8,000 to 15,000 Å.

Figure 3:
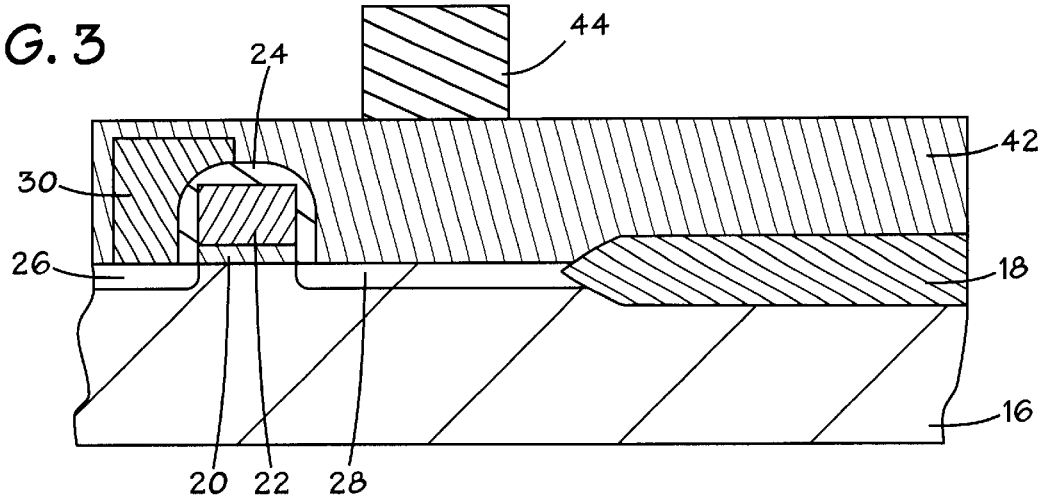
FIG. 3 is a cross-sectional view like FIG. 2 depicting masking of the silicon film in accordance with the present invention.

Referring now to FIG. 3, a mask structure 44 composed of well-known resist materials is fabricated on the silicon film 42 with the desired geometry for the later formed storage electrode. Referring now to FIG. 3 and also to FIG. 4, the silicon film 42 shown in FIG. 3 is anisotropically etched as shown in FIG, 4 to define the initial shape for the storage electrode 32. Well-known anisotropic etching techniques may be employed, such as, for example, reactive ion etching, chemical plasma etching, or the like.

Figure 4:
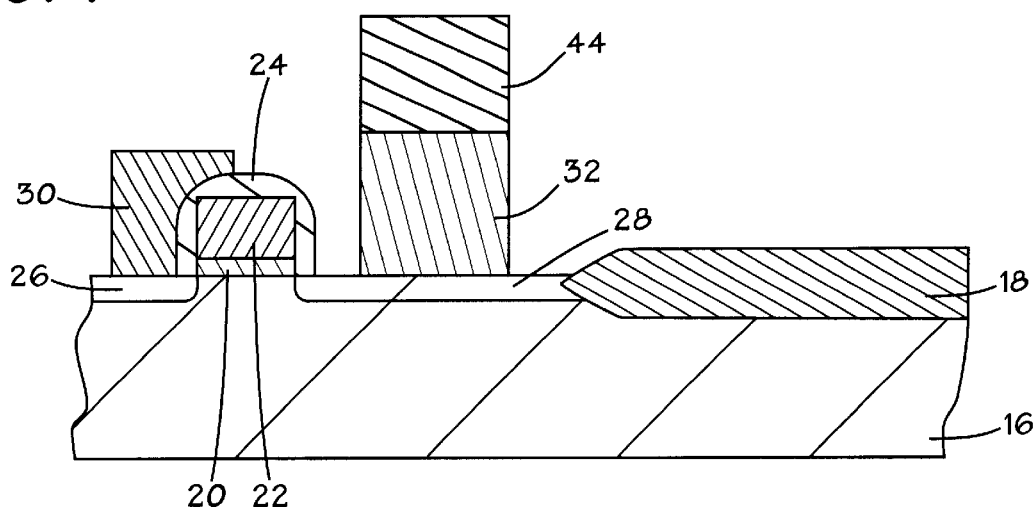
FIG. 4 is a cross-sectional view like FIG. 3 depicting patterning of the silicon film to define a capacitor electrode in accordance with the present invention.
Figure 5:
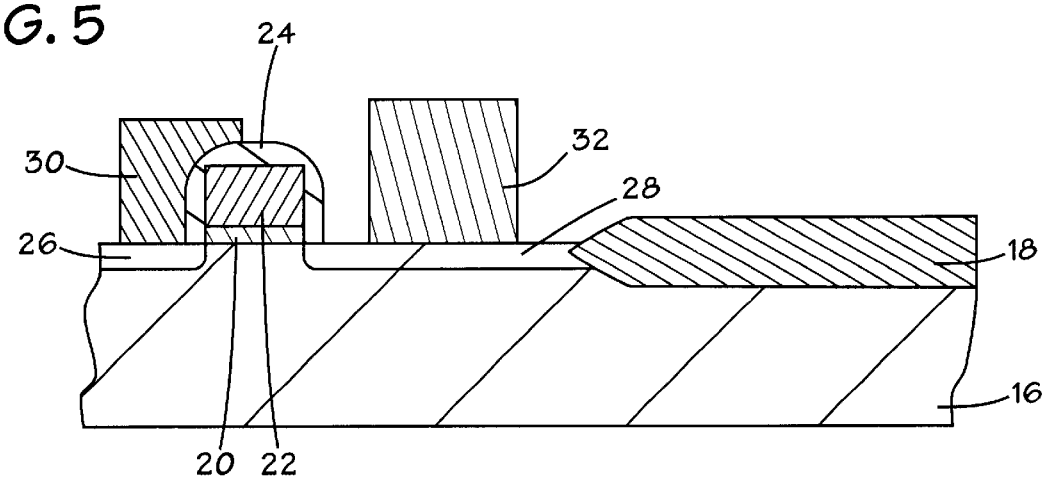
FIG. 5 is a cross-sectional view like FIG. 4 depicting removal of the mask in accordance with the present invention.
Figure 6:
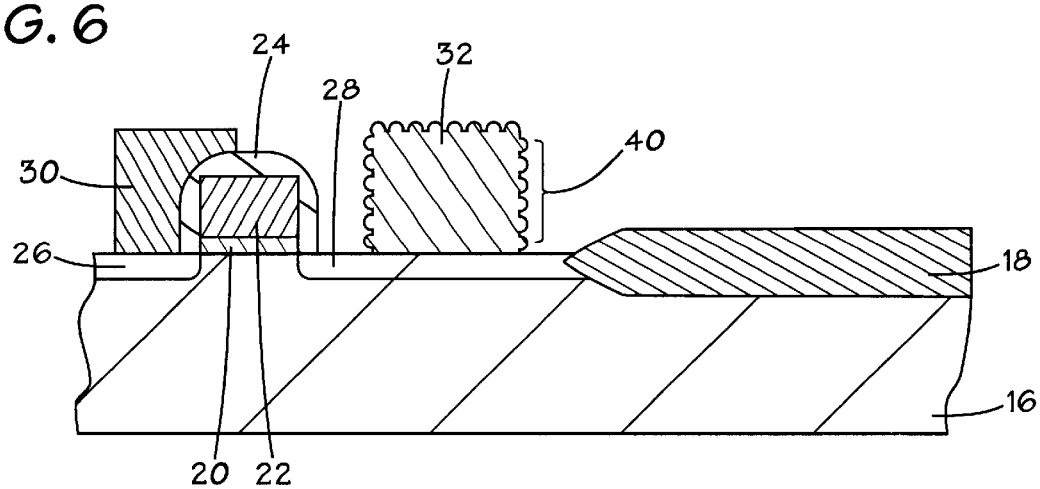
FIG. 6 is a cross-sectional view like FIG. 5 depicting formation of an HSG silicon film on the electrode in accordance with the present invention.

Referring now to FIG. 5, the resist structure 44 depicted in FIG. 4 is stripped by well-known ashing techniques to leave the exposed storage electrode 32. Thereafter, and as shown in FIG. 6, the HSG silicon layer 40 is formed on the storage electrode 32. The HSG silicon film 40 may be fabricated using a variety of known techniques, such as, for example, gas-phased nucleation or by surface seeding followed by low pressure CVD ("LPCVD"). In one embodiment, the storage electrode 32 may be formed as amorphous silicon that is thereafter subjected to a vacuum anneal to redistribute silicon atoms that form HSG silicon. Alternatively, the storage electrode 32 may be initially fabricated as an amorphous silicon structure that is thereafter exposed to disilane to form crystal seed sites on the electrode 32.

Figure 7:
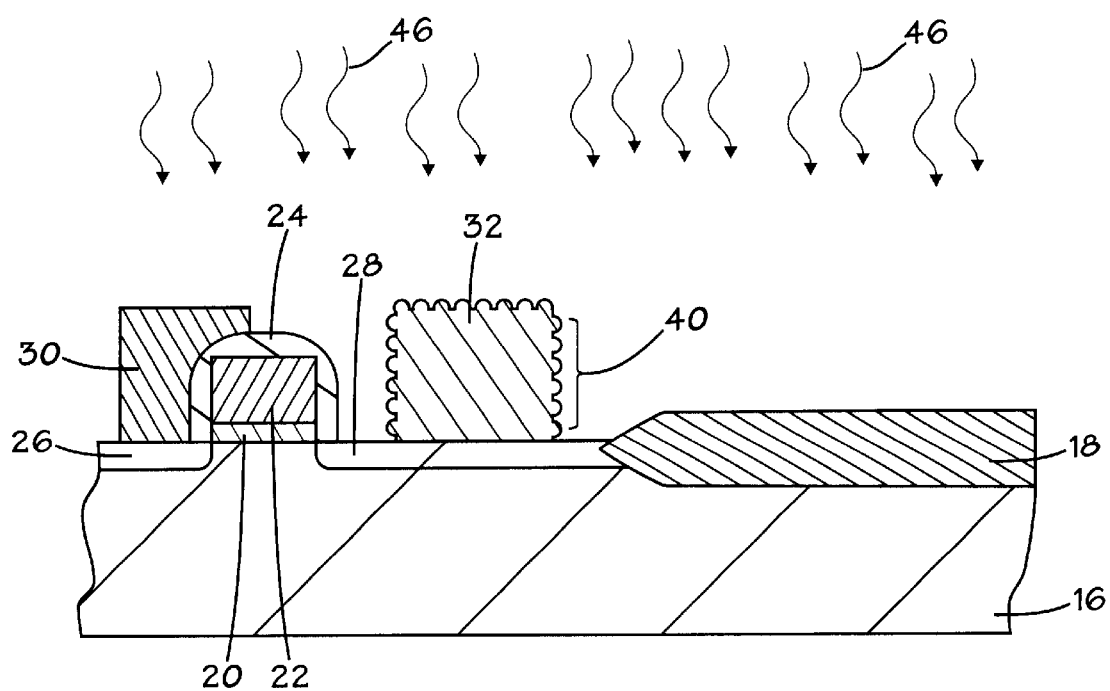
FIG. 7 is a cross-sectional view like FIG. 6 depicting a dopant anneal of the substrate in accordance with the present invention.

Regardless of the particular method used to fabricate the HSG silicon film 40, the doping level of the storage electrode 32 is kept relatively low prior to the HSG formation step. Accordingly, additional dopant must be added to the storage electrode 32 following HSG silicon formation. Referring now to FIG. 7, the doping level of the storage electrode 32 is ramped up by annealing the substrate 16 in the presence of a dopant gas 46. Again, a variety of dopant gases may be used, such as for example, $AsH_3$, $AsS_3$, $PH_3$, $PF_3$, $POCl_3$, $B_2A_6$, $BF_3$, $BCl_3$, etc. depending on the conductivity type desired (i.e., either n-type or p-type). In an exemplary embodiment, the dopant gas is phosphine. As noted above, the conventional method of performing the dopant anneal of the storage electrode involves first ramping the temperature of the substrate 16 up to a desired annealing temperature and thereafter introducing the phosphine into the annealing chamber. In contrast, the process according to the present invention provides for exposure of the substrate 16 to the dopant gas while the temperature of the substrate 16 is ramped up to the annealing temperature.

Initially, a flow of an inert gas, such as nitrogen is introduced into a reaction chamber (not shown) to bring the pressure within the chamber up to between about 180 and 300 torr. The nitrogen flow is provided to stabilize the pressure within the chamber and to purge any contaminants that might be present therein. Next, the flow of dopant gas into the chamber and the anneal cycle are commenced. The flow of dopant gas is advantageously commenced just prior to the commencement of the annealing cycle and may be even be performed simultaneously with the annealing cycle. The substrate 16 is heated from the reaction chamber ambient temperature up to about 675° C. at about 27.5° C./minute. The flow of phosphine is quickly ramped up and held at about 500 sccm. The substrate 16 is held at the anneal temperature for about 45 minutes. Thereafter, the flow of phosphine is shut off and the chamber is flushed with an inert gas, such as nitrogen gas. The substrate 16 is thereafter cooled gradually at about 3.3° C./minute back down to room temperature.

In an exemplary embodiment, an Applied Materials Endura is used to perform the dopant anneal, although other tools may be used. The skilled artisan will appreciate that the aforementioned anneal flow rates and temperatures are somewhat tool-dependent and thus largely matters of design discretion.

Experiment has shown that by introducing the dopant gas during the temperature ramp up, adequate quantities of dopant may be introduced into the HSG film 40 before the film's level of crystallization due to the heating cycle becomes extensive enough to prevent the ready diffusion of dopant into the electrode 32. Thus, the simultaneous dopant gas flow and temperature ramp up provides for a delayed onset of amorphous state-to-crystalline state transformation so that adequate dopant diffuses into the electrode 32. If desired, an amorphous state-to-crystalline state transformation may occur, albeit later in the anneal cyclic.

Referring again to FIG. 1, the capacitor dielectric may be fabricated on the storage electrode 32 using well-known techniques, such as LPCVD or thermal oxidation. The upper electrode 36 may be similarly fabricated on the capacitor dielectric 34 using well-known deposition and patterning techniques, such as LPCVD, physical vapor deposition or the like, The interlevel dielectric layer 38 may then be formed by well-known blanket deposition techniques, such as LPCVD.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a circuit device on a substrate, comprising:

forming a doped silicon structure on the substrate;

forming a hemispherical grain silicon film on the silicon structure; and heating the substrate from a first temperature to a second temperature while exposing the substrate to a dopant gas to add a dopant to the hemispherical grain silicon film.

2. The method of claim 1, wherein the forming of the hemispherical grain silicon comprises forming a silicon nuclei seed layer on the silicon structure.

3. The method of claim 1, wherein the forming of the doped silicon structure comprises forming in-situ phosphorus doped silicon.

4. The method of claim 3, wherein the silicon structure comprises polysilicon.

5. The method of claim 1, wherein the dopant gas comprises phosphine.

6. The method of claim 1, wherein the dopant gas is exposed to the substrate prior to heating the substrate.

7. The method of claim 1, wherein the dopant gas is purged and the substrate is cooled from the second temperature.

8. A method of fabricating a capacitor structure on a substrate, comprising:

forming a doped silicon structure on the substrate;

forming a hemispherical grain silicon film on the silicon structure;

heating the substrate from a first temperature to a second temperature while exposing the substrate to a dopant gas to add a dopant to the hemispherical grain silicon film; and forming a capacitor dielectric film on the hemispherical grain silicon film.

9. The method of claim 8, wherein the forming of the hemispherical grain silicon comprises forming a silicon nuclei seed layer on the silicon structure.

10. The method of claim 9, wherein the forming of the doped silicon structure comprises forming in-situ phosphorus doped silicon.

11. The method of claim 10, wherein the silicon structure comprises polysilicon.

12. The method of claim 9, wherein the dopant gas comprises phosphine.

13. The method of claim 9, wherein the dopant gas is exposed to the substrate prior to heating the substrate.

14. The method of claim 9, wherein the dopant gas is purged and the substrate is cooled from the second temperature.

15. A method of fabricating a circuit device on a substrate, comprising:

forming an access transistor; and forming a capacitor electrode by forming a doped silicon structure on the substrate, forming a hemispherical grain silicon film on the silicon structure, and heating the substrate from a first temperature to a second temperature while exposing the substrate to a dopant gas to add a dopant to the hemispherical grain silicon film.

16. The method of claim 15, wherein the forming of the hemispherical grain silicon comprises forming a silicon nuclei seed layer on the silicon structure.

17. The method of claim 15 wherein the forming of the doped silicon structure comprises forming in-situ phosphorus doped silicon.

18. The method of claim 17, wherein the silicon structure comprises polysilicon.

19. The method of claim 15, wherein the dopant gas comprises phosphine.

20. The method of claim 15, wherein the dopant gas is exposed to the substrate prior to heating the substrate.

* * * * *